(12) United States Patent
Xiao

(10) Patent No.: US 10,083,879 B2
(45) Date of Patent: Sep. 25, 2018

(54) SEMICONDUCTOR NANOWIRE DEVICE AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventor: Deyuan Xiao, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/341,943

(22) Filed: Nov. 2, 2016

(65) Prior Publication Data

US 2017/0162452 A1 Jun. 8, 2017

(30) Foreign Application Priority Data

Dec. 8, 2015 (CN) .......................... 2015 1 0897267

(51) Int. Cl.
*H01L 21/84* (2006.01)
*H01L 21/02* (2006.01)
(Continued)

(52) U.S. Cl.
CPC ........ *H01L 21/84* (2013.01); *H01L 21/02236* (2013.01); *H01L 21/31105* (2013.01);
(Continued)

(58) Field of Classification Search
CPC ......... H01L 21/02236; H01L 21/31105; H01L 21/823807; H01L 21/8252; H01L 27/1222;
(Continued)

(56) References Cited

U.S. PATENT DOCUMENTS 8,872,161 B1 10/2014 Ching et al.
2005/0272231 A1 12/2005 Yun et al.
(Continued)

FOREIGN PATENT DOCUMENTS

CN 104282575 A 1/2015
CN 103346070 B 8/2015

OTHER PUBLICATIONS

The European Patent Office (EPO) The Extended European Search Report for 16200407.1 dated Sep. 25, 2017 15 Pages.

*Primary Examiner* — Joseph Galvin, III
(74) *Attorney, Agent, or Firm* — Anova Law Group, PLLC

(57) ABSTRACT

A method for fabricating a semiconductor nanowire device includes forming a base including a plurality of PMOS regions, forming a plurality of first openings in the base of the PMOS regions, forming a plurality of first epitaxial wires by filling the first openings with a germanium-containing material, and forming a plurality of second openings in the base by etching a portion of the base under each first epitaxial wire. Each first epitaxial wire is connected to both sidewalls of a corresponding second opening and is hung above a bottom surface of the corresponding second opening. The method also includes performing a thermal oxidation treatment process on the plurality of first epitaxial wires to form an oxide layer on each first epitaxial wire, forming a plurality of first nanowires by removing the oxide layer
(Continued)

from each first epitaxial wire, and forming a first wrap-gate structure to surround each first nanowire.

20 Claims, 10 Drawing Sheets

(51) Int. Cl.
  H01L 21/311    (2006.01)
  H01L 27/12     (2006.01)
  H01L 29/06     (2006.01)
  H01L 29/267    (2006.01)
  H01L 29/423    (2006.01)
  H01L 29/786    (2006.01)
  H01L 29/775    (2006.01)
  H01L 29/10     (2006.01)
  H01L 21/8238   (2006.01)
  H01L 21/8252   (2006.01)
  H01L 21/8258   (2006.01)
  H01L 29/161    (2006.01)
  H01L 29/20     (2006.01)
  H01L 29/66     (2006.01)

(52) U.S. Cl.
  CPC ...... *H01L 27/1222* (2013.01); *H01L 27/1225* (2013.01); *H01L 29/0673* (2013.01); *H01L 29/1054* (2013.01); *H01L 29/267* (2013.01); *H01L 29/42392* (2013.01); *H01L 29/66439* (2013.01); *H01L 29/775* (2013.01); *H01L 29/78684* (2013.01); *H01L 29/78696* (2013.01); *H01L 21/8252* (2013.01); *H01L 21/8258* (2013.01); *H01L 21/823807* (2013.01); *H01L 29/161* (2013.01); *H01L 29/20* (2013.01); *H01L 29/66522* (2013.01); *H01L 29/66742* (2013.01)

(58) Field of Classification Search
  CPC ............. H01L 29/0673; H01L 29/1054; H01L 29/161; H01L 29/20
  See application file for complete search history.

(56) References Cited

U.S. PATENT DOCUMENTS

| | | |
|---|---|---|
| 2007/0212879 A1 | 9/2007 | Grasby |
| 2010/0151659 A1 | 6/2010 | Hong et al. |
| 2010/0164102 A1 | 7/2010 | Rachmady et al. |
| 2011/0147697 A1* | 6/2011 | Shah ................... B82Y 10/00 257/9 |
| 2012/0036919 A1* | 2/2012 | Kamins ................ G01N 27/127 73/31.05 |
| 2014/0151705 A1 | 6/2014 | Xiao et al. |
| 2014/0183643 A1 | 7/2014 | Colinge et al. |
| 2014/0197377 A1 | 7/2014 | Kim et al. |
| 2014/0210013 A1 | 7/2014 | Kim |
| 2015/0035071 A1 | 2/2015 | Ching et al. |
| 2015/0228480 A1 | 8/2015 | Yin et al. |
| 2015/0249139 A1* | 9/2015 | Cheng ............... H01L 29/42392 438/504 |
| 2016/0064531 A1 | 3/2016 | Xiao |
| 2016/0190336 A1* | 6/2016 | Xiao ..................... B82Y 30/00 257/29 |

* cited by examiner

SEMICONDUCTOR NANOWIRE DEVICE AND FABRICATION METHOD THEREOF

CROSS-REFERENCES TO RELATED APPLICATIONS

This application claims the priority of Chinese Patent Application No. CN201510897267.X, filed on Dec. 8, 2015, the entire content of which is incorporated herein by reference.

FIELD OF THE DISCLOSURE

The present disclosure generally relates to the field of semiconductor fabrication technology and, more particularly, relates to a semiconductor nanowire device and fabrication methods thereof.

BACKGROUND

With rapid development of semiconductor fabrication technology, semiconductor devices are developed towards a direction of having a higher component density and a higher integration degree. As one of the most fundamental semiconductor devices, transistors have been widely used. With the improvement of the component density and the integration degree, the size of transistors also becomes smaller and smaller. However, problems arise. For example, short channel effect and current leakage in compact semiconductor devices may lead to degradation of the performance of the transistors. Therefore, the methods to improve the performance of semiconductor devices by reducing the physical dimensions of traditional transistors may face a series of challenges.

Currently, a semiconductor nanowire device is proposed in order to overcome the difficulty in reducing the physical dimensions of traditional semiconductor transistors. Specifically, the semiconductor nanowire device uses a nanowire as the device channel. In such a semiconductor nanowire device, the on-off current ratio may be high, and the short channel effect such as the drain-induced barrier lowering effect may not be significant so that the performance of the semiconductor nanowire device may not be degraded.

However, current methods for fabricating semiconductor nanowire devices may not be able to ensure the performance and the stability of the devices. The disclosed device and fabrication method are directed to solve one or more problems set forth above and other problems in the art.

BRIEF SUMMARY OF THE DISCLOSURE

One aspect of the present disclosure includes a method for fabricating a semiconductor device. The method includes forming a base including a plurality of PMOS regions, forming a plurality of first openings in the base of the PMOS regions, forming a plurality of first epitaxial wires by filling the plurality of first openings in the PMOS regions with a germanium-containing material, and forming a plurality of second openings in the base of the PMOS regions by etching a portion of the base under each first epitaxial wire. Each first epitaxial wire is connected to both sidewalls of a corresponding second opening and is hung above a bottom surface of the corresponding second opening. The method also includes performing a thermal oxidation treatment process on the plurality of first epitaxial wires to form an oxide layer on each first epitaxial wire, forming a plurality of first nanowires by removing the oxide layer from each first epitaxial wire, and forming a first wrap-gate structure to surround each first nanowire.

Another aspect of the present disclosure provides a semiconductor nanowire device. The semiconductor nanowire device includes a base including a plurality of PMOS regions and a plurality of NMOS regions formed on a semiconductor substrate, and a plurality of isolation structures formed in the PMOS regions and the NMOS regions. The semiconductor nanowire device further includes a plurality of first nanowires formed in the base of the PMOS regions and a first wrap-gate structure surrounding each first nanowire, a plurality of second nanowires formed in the base of the NMOS regions and a second wrap-gate structure surrounding each second nanowire, and a barrier layer formed between the semiconductor substrate and each first wrap-gate structure and also between the semiconductor substrate and each second wrap-gate structure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

FIGS. 1-4 show schematic views of semiconductor structures corresponding to certain stages of an existing fabrication method for a semiconductor nanowire device.

Figure 1:
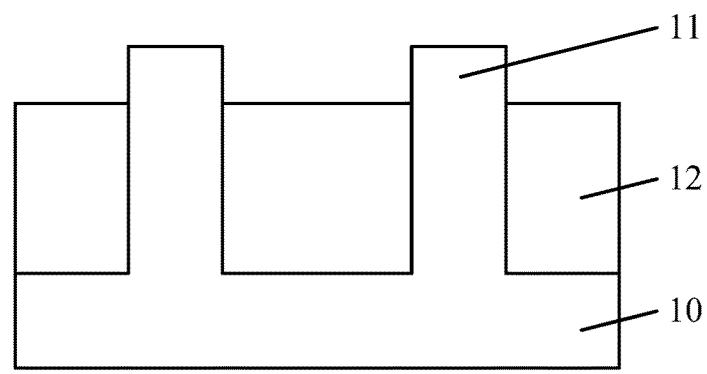
FIGS. 1-4 illustrate schematic views of semiconductor structures corresponding to certain stages of an existing fabrication method for a semiconductor nanowire device.

Referring to FIG. 1, at the beginning of the fabrication process, a silicon substrate 10 is provided. A plurality of fin structures 11 are formed on the substrate 10 by etching the substrate 10. In addition, an isolation layer 12 is formed between neighboring fin structures 11.

Figure 2:
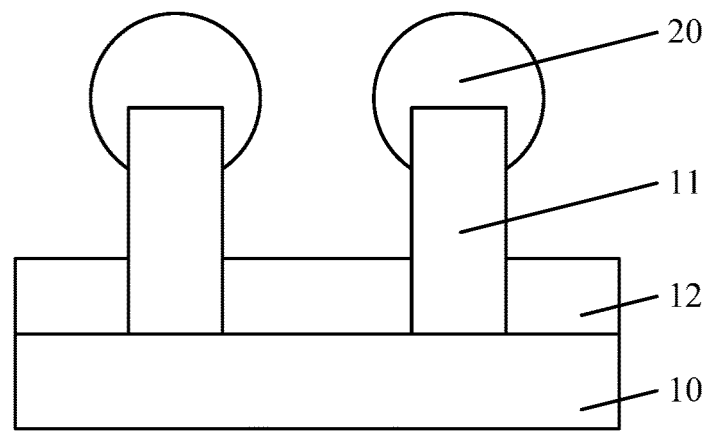

Further, referring to FIG. 2, a silicon germanium epitaxial wire 20 is formed on the top of each fin structure 11 by a selective epitaxial growth method. After forming the silicon germanium epitaxial wire 20, an etch back process is then performed on the isolation layer 12 until a portion of the side surfaces of each fin structure 11 is exposed.

Figure 3:
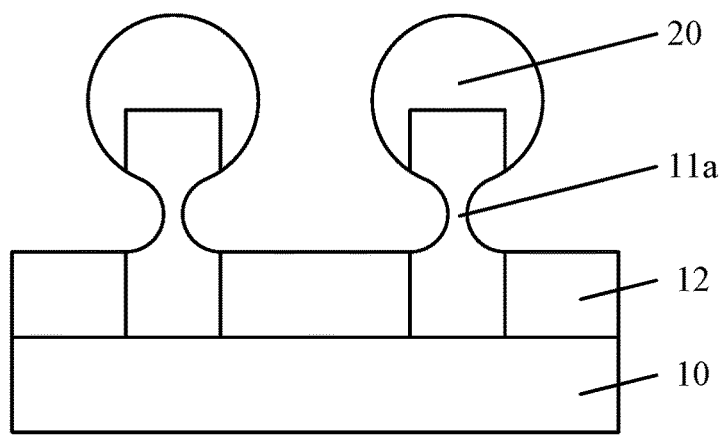

Referring to FIG. 3, further, a portion of the side surfaces of each fin structure 11 may be removed to let the side surfaces of the fin structure 11 be necked-in.

Figure 4:
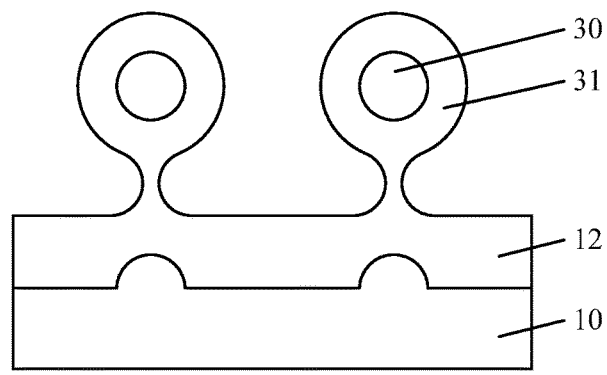

Referring to FIG. 4, further, a germanium nanowire 30 is formed by an oxidation anneal process performed on the silicon germanium epitaxial wire 20. The surface of the germanium nanowire 30 is covered by an oxide layer 31.

Referring to FIG. 3, the silicon germanium epitaxial wire 20 is formed to surround the top end of the fin structure 11. Therefore, the silicon germanium epitaxial wire 20 is an epitaxial wire with a silicon core. During the subsequent oxidation anneal process, germanium can migrate towards the center and then form the germanium nanowire 30. However, improving the concentration of germanium in the germanium nanowire 30 still faces challenges because the concentration of silicon in the core region is high. Therefore, the germanium concentration in the nanowire of the formed semiconductor device is very low so that the performance of the formed semiconductor device may be affected.

The present disclosure provides a fabrication method to solve the problems in forming germanium nanowires. As used herein, the term "germanium nanowire" may be referred to as "germanium-containing nanowire" having a germanium concentration greater than 0, but less than or equal to 100%, by weight. As such, the term "germanium nanowires" and "germanium-containing nanowire" may be interchangeably used herein.

Figure 23:
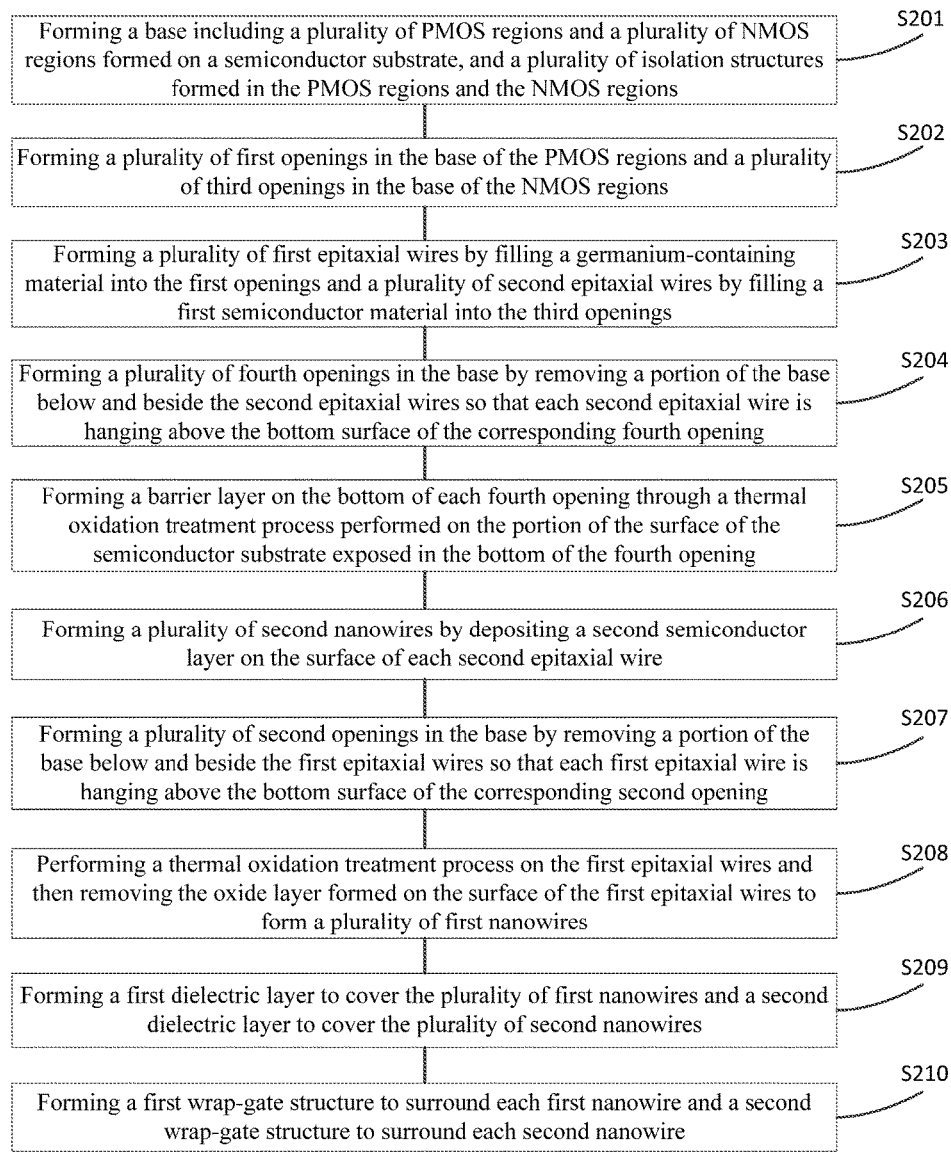
FIG. 23 illustrates a flowchart of an exemplary fabrication process consistent with disclosed embodiments.

FIG. 23 shows a flowchart of an exemplary fabrication method consistent with disclosed embodiments.

Figure 5:
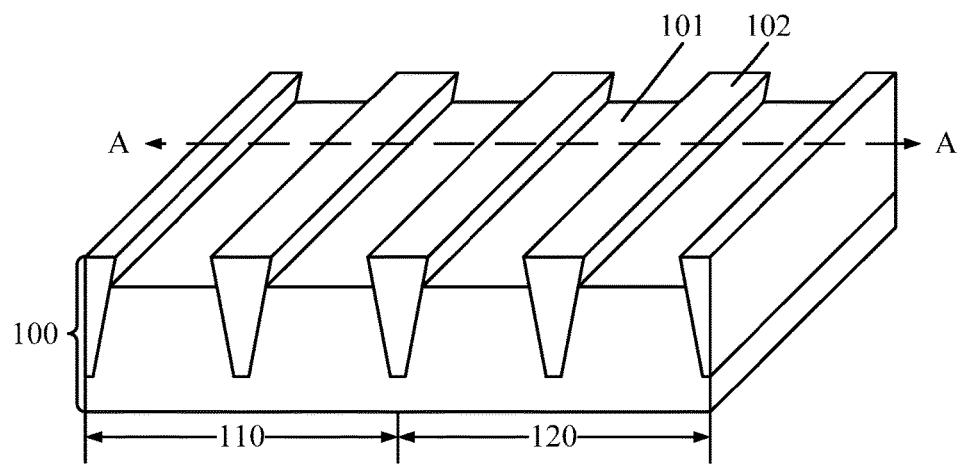
FIGS. 5-22 illustrate schematic views of semiconductor structures corresponding to certain stages of an exemplary fabrication method for semiconductor nanowire devices consistent with disclosed embodiments.
Figure 6:
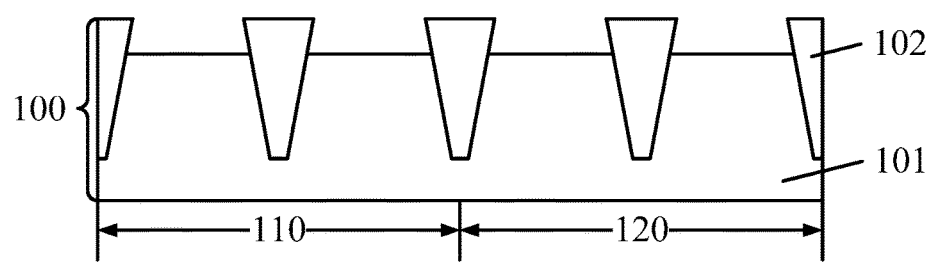

Referring to FIG. 23, at the beginning of the fabrication process, a base including a plurality of PMOS regions and a plurality of NMOS regions formed on a semiconductor substrate is provided (S201). FIG. 5 shows the corresponding semiconductor structure. FIG. 6 shows a schematic cross-sectional view of the semiconductor structure shown in FIG. 5 along an AA line.

Referring to FIG. 5 and FIG. 6, at the beginning of the fabrication process, a base 100 may be formed. In one embodiment, the base 100 may include a plurality of PMOS regions 110 and a plurality of NMOS regions 120 formed on a semiconductor substrate 101. The plurality of PMOS regions 110 may be further used to form a plurality of PMOS devices while the plurality of NMOS regions 120 may be further used to form a plurality of NOMS devices. For illustration purpose, only a portion of the base 100, including one PMOS region 110 and one NMOS region 120, is shown in FIG. 5 and FIG. 6. However, the number of PMOS regions and/or the number of NMOS regions may be more than one. In certain embodiments, only one or more PMOS regions may be formed on the semiconductor substrate; that is, NMOS region may not be formed on the semiconductor substrate.

The semiconductor substrate 101 may provide a work platform for subsequent fabrication processes. The semiconductor substrate 101 may be made of single crystalline silicon, polycrystalline silicon, or amorphous silicon. The semiconductor substrate 101 may also be made of germanium, gallium arsenide, or silicon germanium. The semiconductor substrate 101 may have an epitaxial layer or may be silicon on an epitaxial layer. Moreover, the semiconductor substrate 101 may also be any appropriate semiconductor material. In one embodiment, the semiconductor substrate 101 is made of silicon.

The plurality of isolation structures 102 may be used to electrically isolate neighboring semiconductor structures. The isolation structures 102 may be made of one or more of $SiO_x$, $SiN_x$, SiON, low-k dielectric material (i.e. material with a dielectric constant greater than or equal to 2.5, but smaller than 3.9), and ultra-low-k dielectric material (i.e. material with a dielectric constant less than 2.5). In one embodiment, the isolation structures 102 are made of $SiO_x$.

The distance between neighboring isolation structures 102 may not be too small; otherwise, subsequent formation of nanowire may be affected. The distance between neighboring isolation structures 102 may not be too large either; otherwise, a large distance may be detrimental to improving the component density and the integration degree. In one embodiment, the distance between neighboring isolation structures 102 may be in a range of 10 nm to 50 nm.

The formation process for the plurality of isolation structures 102 may include the following steps. First, a semiconductor substrate 101 may be provided. A first mask layer (not shown) may then be formed on the semiconductor substrate 101. A plurality of openings may be formed in the first mask layer. The plurality openings may be used to define the dimensions and the positions for the plurality of isolation structures 102. Further, a plurality of trenches may be formed in the semiconductor substrate 101 by etching the semiconductor substrate 101 using the first mask layer as an etch mask. Finally, a plurality of isolation structures 102 may be formed by filling the trenches formed in the semiconductor substrate 101.

Specifically, forming the first mask layer may further include the following steps. First, a first mask material layer may be formed on the surface of the semiconductor substrate 101. A patterned first photoresist layer may then be formed on the surface of the first mask material layer. Further, a first mask layer may be formed by etching the first mask material layer using the first photoresist layer as an etch mask until the surface of the semiconductor substrate 201 is exposed. After transferring the pattern of the first photoresist layer to the first mask layer through the etching process, the first photoresist layer may then be removed.

In one embodiment, the first mask material layer is patterned by using the first photoresist layer. The first photoresist layer may be formed by a spin-coating process followed by a photolithography process. In other embodiments, a multiple mask patterning process may be adopted in order to reduce the dimension of the semiconductor devices to be formed. Specifically, the multiple mask patterning process may include a self-aligned double patterned (SaDP) process, a self-aligned triple patterned (SaTP) process, or a self-aligned double patterned (SaDDP) process.

Moreover, in one embodiment, prior to forming the plurality of isolation structures 102, the fabrication process may also include cleaning the surface of the semiconductor substrate 101 to remove impurities and, thus, to provide a clean operating plane.

In addition, after forming the plurality of isolation structures 102, the fabrication process may further include removing the first mask layer to expose the surface of the semiconductor substrate 101.

Figure 7:
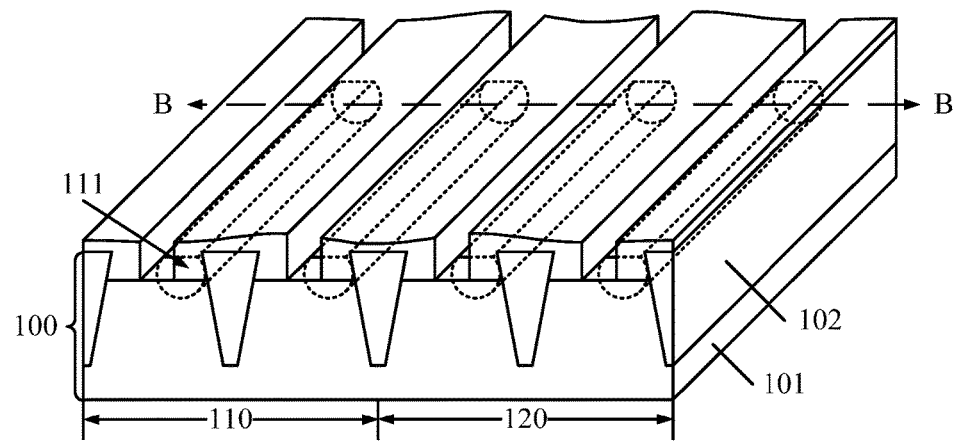
Figure 8:
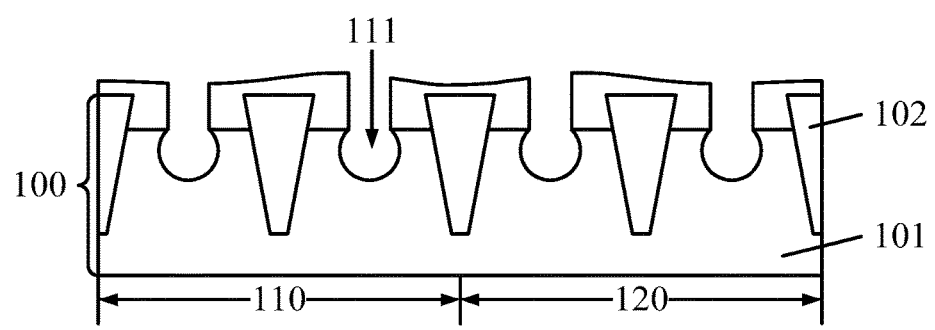

Further, referring to FIG. 23, a plurality of first openings may be formed in the base of the PMOS regions and a plurality of third openings may be formed in the base of the NMOS regions (S202). FIG. 7 shows the corresponding semiconductor structure. FIG. 8 shows a schematic cross-section view of the semiconductor structure shown in FIG. 7 along a BB line.

Referring to FIG. 7 and FIG. 8, a plurality of first openings 111 may be formed in the base 100 of the PMOS regions. The first openings 111 may be used to form a plurality of first epitaxial wires by filling the first openings 111 with a semiconductor material in a subsequent process. Specifically, the cross section of the first openings 111 may have a bowl shape. The plurality of bowl-shaped first openings 111 may be formed in the semiconductor substrate 101 between neighboring isolation structures 102 through a regular plasma dry etching process.

Specifically, the formation process for the plurality of first openings 111 may include the following steps. First, a second mask layer (not shown) may be formed on the surface of the base 100. The second mask layer may be used to define the positions of the first openings 111. A plurality of first openings 111 may then be formed in the semiconductor substrate 101 by etching the semiconductor substrate 101 using the second mask layer as an etch mask.

In one embodiment, the second mask layer is a patterned hard mask film. Specifically, the hard mask film may be made of $SiN_x$ and the fabrication process for the second mask layer may include forming a second mask material layer on the surface of the base 100, forming a second photoresist layer on the surface of the second mask material layer with a plurality of openings formed in the second photoresist layer, and forming the second mask layer by etching the second mask material layer using the second photoresist layer as an etch mask until the surface of the base 100 is exposed.

In one embodiment, the second mask layer may also cover the surface of each isolation structure 102 in order to protect the isolation structure 102 during subsequent fabrication processes. Therefore, the surface of the formed hard mask material layer may be above the top surface of the isolation structures 102.

Similar to the formation of the first mask layer using the first photoresist layer, in one embodiment, the second mask layer may be patterned by using the second photoresist layer. Specifically, the second photoresist layer may be formed by a spin-coating process followed by a photolithography process. In other embodiments, a multiple mask patterning process may be adopted in order to reduce the dimension of the plurality of first openings 111 to be formed.

In one embodiment, the base 100 may also include a plurality of NMOS regions 120 used to form NMOS devices. Therefore, during the formation of the plurality of first openings 111 in the base 100 of the PMOS regions 110, a plurality of first opening 111 may also be simultaneously formed in the base 100 of the NMOS regions 120.

Figure 9:
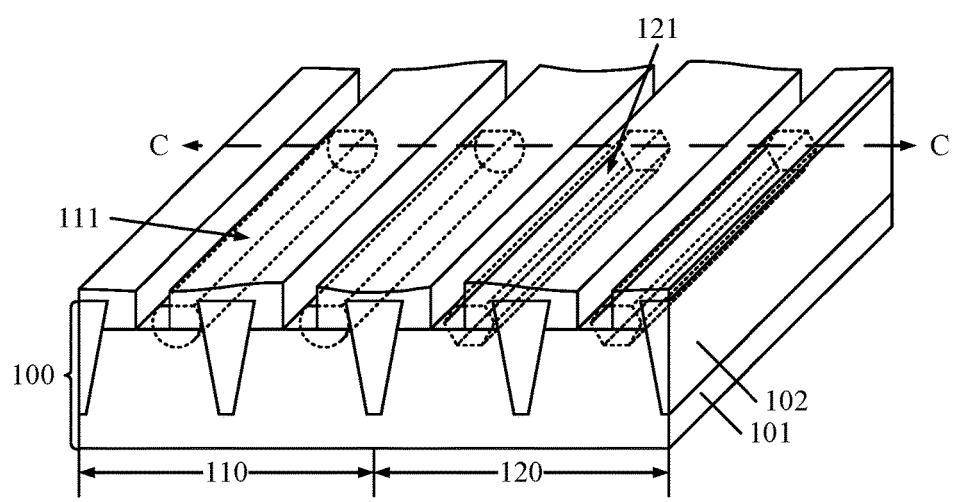
Figure 10:
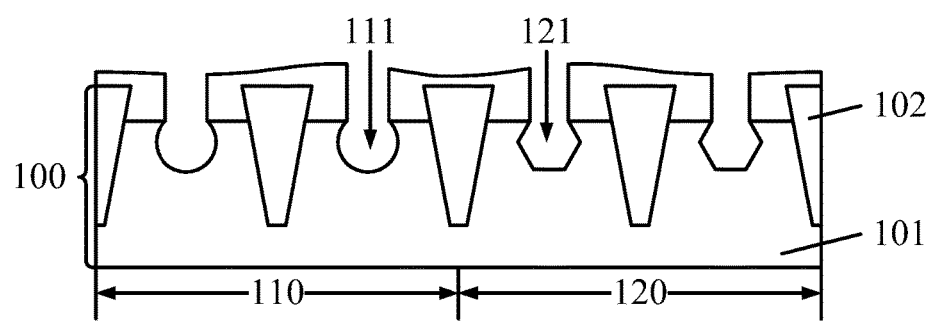

In a subsequent process, a plurality of second nanowires may be formed in the base 100 of the NMOS regions 120. In one embodiment, after forming the plurality of first openings 111 in the base 100 of the PMOS regions 110, a plurality of third openings 121 may be formed in the base 100 of the NMOS regions. The shape of the cross sections of the third openings 121 may be different from the shape of the cross sections of the first openings 111. FIG. 9 shows the corresponding semiconductor structure. FIG. 10 shows a schematic cross-section view of the semiconductor structure shown in FIG. 9 along a CC line.

Referring to FIG. 9 and FIG. 10, a plurality of third openings 121 may be formed in the NMOS regions 120. The cross section of each third opening 121 may have a sigma shape, for example. In one embodiment, the plurality of third openings 121 may be formed from the plurality of first openings 111 in the NMOS regions, which are simultaneously formed with the first openings 111 in the PMOS regions.

In a subsequent process, the plurality of third openings 121 may be filled with a semiconductor material to form a plurality of second epitaxial wires. Further, a second semiconductor layer may be formed on the surface of each second epitaxial surface in order to form a second nanowire. The channels of the NMOS devices formed in the NMOS regions may be formed in the plurality of second nanowires. Specifically, during the fabrication process, forming sigma-shaped third openings 121 may ensure the formation of sigma-shaped second epitaxial wires so that the channels of the NMOS devices formed subsequently in the second nanowires may be along the (111) crystal direction, and thus the mobility of charge carriers may be increased.

Specifically, a wet etching process may be performed on the plurality of first openings 111 formed in the base 100 of the NMOS regions in order to further form sigma-shaped third openings 121. The wet etching process may use a tetramethylammonium hydroxide (TMAH) solution as an etch solution. In addition, during the wet etching process, the temperature of the etch solution may be kept in a range of 15° C. to 70° C.; the etch time may be in a range of 20 seconds to 500 seconds. In other embodiments, the wet etching process may also use a KOH solution or an aqueous ammonia solution as an etch solution.

In one embodiment, a third mask layer (not shown) may be formed to cover the PMOS regions 110 after forming the first openings 111, but before forming the third openings 121. The third mask layer may provide desired protection for the first openings 111 formed in the PMOS regions 120 during the process to form the plurality of third openings 121. Accordingly, after forming the third openings 121, the fabrication process may further include removing the third mask layer and/or then cleaning the semiconductor device.

Figure 11:
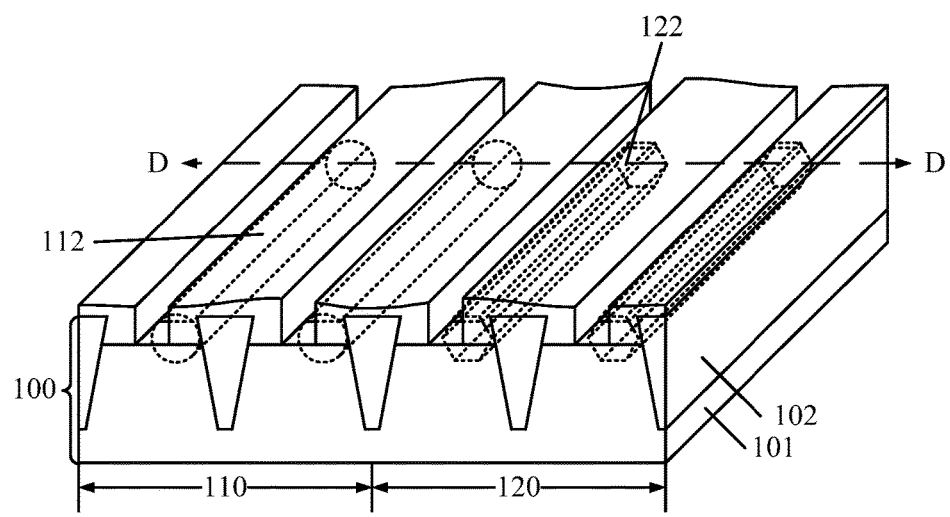
Figure 12:
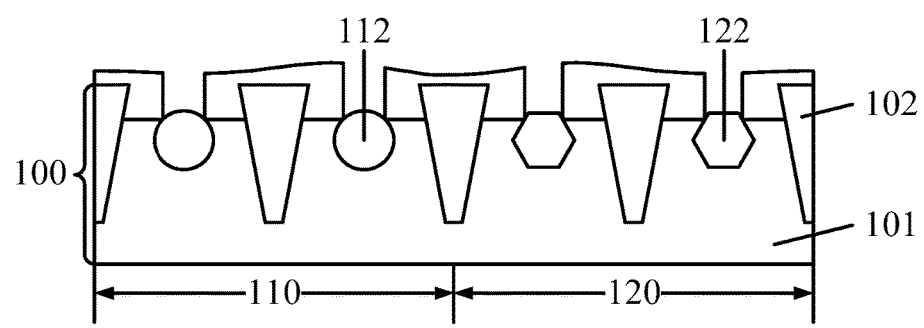

Further, returning to FIG. 23, a plurality of first epitaxial wires may be formed by filling a germanium-containing material, such as silicon germanium or any suitable material (s), into the first openings of the PMOS regions while a plurality of second epitaxial wires may be formed by filling a first semiconductor material into the third openings of the NMOS regions (S203). FIG. 11 shows a schematic view of the corresponding semiconductor structure. FIG. 12 shows a schematic cross-section view of the semiconductor structure shown in FIG. 11 along a DD line.

Referring to FIG. 11 and FIG. 12, the germanium-containing material, such as silicon germanium or any suitable material(s), may be filled into first openings 111 in the PMOS regions 110 to form a plurality of first epitaxial wire 112. The first epitaxial wires 112 may be used to further form a plurality of first nanowires. The first nanowire may then be used as the channels of the subsequently-formed PMOS devices. In one embodiment, the first epitaxial wires 112 may be formed by a chemical vapor deposition (CVD) process, a molecular beam epitaxy (MBE) process, or an atomic layer deposition (ALD) process.

Specifically, in one embodiment, the first epitaxial wires 112 are formed by filling the germanium-containing material into the first openings 111 through a metal-organic chemical vapor deposition (MOCVD) process.

Because the first epitaxial wires 112 may be formed by directly filling the first openings 111 with the germanium-containing material, the distribution of the germanium-containing material in the first epitaxial wires 112 may be uniform, which may be conducive to improving germanium concentration in the first nanowires subsequently formed through a to thermal oxidation treatment process. In addition, uniformly distributed germanium-containing material in the first epitaxial wires 112 may also help to improve the channel properties of the ultimately formed semiconductor device, and thus improve the performance of the semiconductor device.

Further, the length of the first epitaxial wires 112 may not be too long; otherwise, the length of the subsequently formed first nanowires may also be excessively long, which may be harmful to improving the integration degree of the ultimately formed semiconductor device. The length of the first epitaxial wires 112 may not be too short either; otherwise, the length of the subsequently formed first nanowires may also be excessively short, which may increase the difficulties of the fabrication process and may also affect the performance of the formed semiconductor device. In one embodiment, the length of the first epitaxial wires 112, i.e. L, may be in a range of 2 nm to 50 nm.

Moreover, the diameter of the first epitaxial wires 112 may not be too large; otherwise, the diameter of the subsequently formed first nanowires may also be excessively large, which may be harmful to improving the integration degree of the ultimately formed semiconductor device. The diameter of the first epitaxial wires 112 may not be too small either; otherwise, the diameter of the subsequently formed first nanowires may also be excessively short, which may affect the performance of the formed semiconductor device and may also increase the difficulties of the fabrication process. In one embodiment, the diameter of the first epitaxial wires 112 may be in a range of 2 nm to 5 nm.

In one embodiment, the base 100 may also include a plurality of NMOS regions for forming NMOS devices. Accordingly, a first semiconductor material may be filled in to the third openings 121 in the NMOS regions to form a plurality of second epitaxial wires 122.

The first semiconductor material may or may not be the same material used to form the first epitaxial wires 112. When the first semiconductor material is also the same germanium-containing material used to form the plurality of first epitaxial wires 112, the second epitaxial wires 122 may be formed simultaneously with the first epitaxial wires 112. When the first semiconductor material used to form the second epitaxial wires 122 is not the same material used to form the first epitaxial wires 112, the plurality of second epitaxial wires 122 may be formed by a fabrication process performed before or after the formation of the plurality of first epitaxial wires 112. Specifically, a mask layer may be formed to cover the NMOS regions during the formation of the first epitaxial wires 112 and then be removed after the first epitaxial wires 112 are formed; while another mask layer may be formed to cover the PMOS regions during the formation of the second epitaxial wires 122 and then be removed after the second epitaxial wires 122 are formed.

The second epitaxial wires 122 may be used to form a plurality of second nanowires. The plurality of second nanowires may serve as the channels of the subsequently formed NMOS devices. The plurality of second nanowires 122 may be formed by a CVD process, an MBE process, an ALD process, or any other appropriate process.

In one embodiment, the first semiconductor material filled into the third openings 121 may also be the germanium-containing material used to form the plurality of first epitaxial wires 112. Therefore, during the process to form the first epitaxial wires 112 by filling the first openings 111, the second epitaxial wires 122 may also be simultaneously formed as the germanium-containing material fills into the third openings 121. In one embodiment, the plurality of second epitaxial wires 122 may also be formed by the same MOCVD method used to form the plurality of first epitaxial wires 112.

In one embodiment, the cross-section of the third openings 121 may have a sigma shape. Therefore, the cross-section of the second epitaxial wires 122 may also have a sigma shape. As such, a second semiconductor layer subsequently formed on the surface of the second epitaxial wires 122 may have a crystal structure along the (111) direction so that the channel electron mobility may be faster.

In a subsequent process, a portion of the base 100 below and beside each first epitaxial wire or each second epitaxial wire is removed to form an opening in the base 100. As such, each first epitaxial wire may be hung above the bottom surface of an opening formed in the corresponding PMOS region with the two ends of the first epitaxial wire connected with the sidewalls of the opening, while each second epitaxial wire may be hanging in an opening formed in the corresponding NMOS region with the two ends of the second epitaxial wire connected with the sidewalls of the opening.

Figure 13:
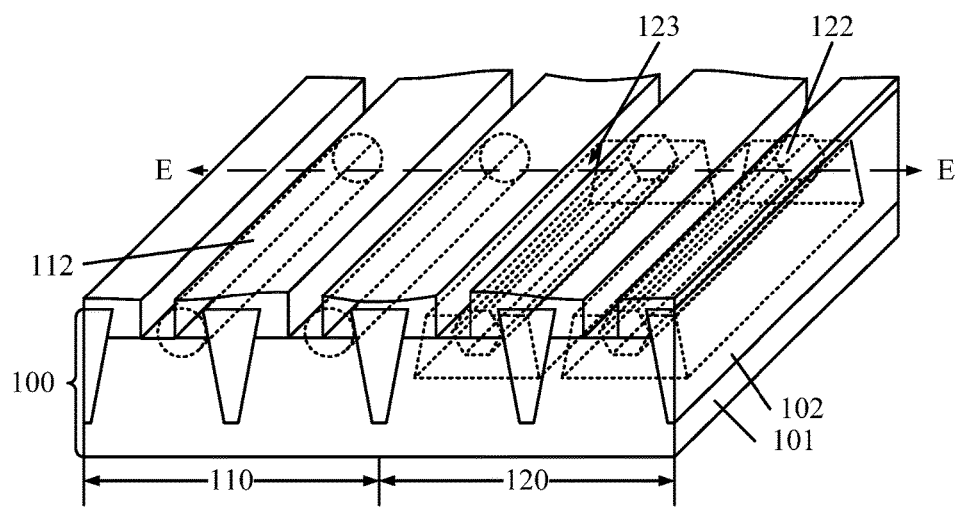
Figure 14:
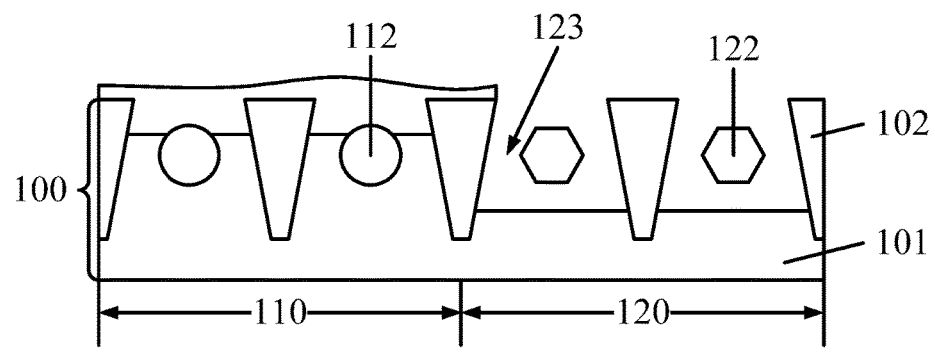

Specifically, returning to FIG. 23, a portion of the base below and beside the second epitaxial wires may be removed by etching to form a plurality of fourth openings in the base with each second epitaxial wire hanging above the bottom surface of the corresponding fourth opening (S204). FIG. 13 shows the corresponding semiconductor structure. FIG. 14 shows a schematic cross-section view of the semiconductor structure shown in FIG. 13 along an 'EE' line.

Referring to FIG. 13 and FIG. 14, a portion of the base below and beside each second epitaxial wire 122 may be removed by etching to form a fourth opening 123 in the base 100 of the corresponding NMOS region 120. After etching, each second epitaxial wire 122 may be connected with the sidewalls of a corresponding fourth opening 123 and may be hanging above the bottom of the fourth opening 123.

Moreover, in order to protect the plurality of first epitaxial wires 112 formed in the base 100 of the PMOS regions, after forming the second epitaxial wires 122 and prior to the formation of the fourth openings 123, the fabrication method may further include forming a fourth mask layer on the surface of the base 100 of the PMOS regions to protect the plurality of first epitaxial wires 112.

The depth of the fourth openings 123 may not be too small. When the depth of the fourth openings 123 is very small, it might be difficult to suspend the second epitaxial wires 122 above the base 100 in the fourth openings 123. In addition, a small depth of the fourth openings 123 may not be conducive to forming a gate electrode in a subsequent process to surround each second nanowire. The depth of the fourth openings 123 may not be too large either. When the depth of the fourth openings 123 is excessively large, the fabrication process may be more difficult and the materials may be wasted. Therefore, in one embodiment, the depth of the fourth openings 123 may be in a range of 50 nm to 100 nm.

Figure 15:
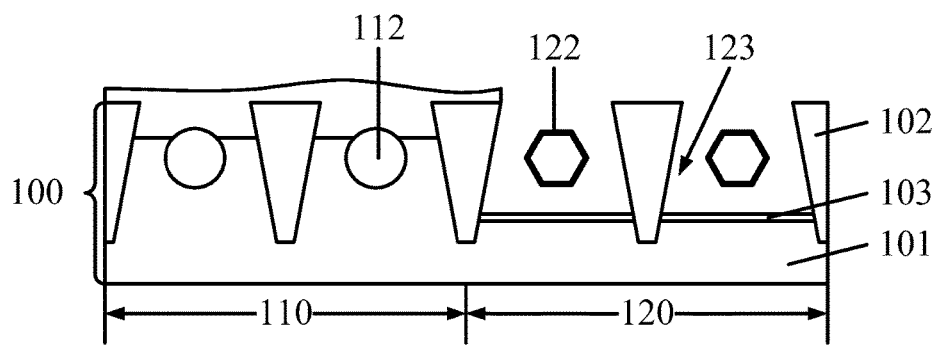

Further, returning to FIG. 23, a barrier layer may be formed on the bottom of each fourth opening through a thermal oxidation treatment process performed on the portion of the surface of the semiconductor substrate exposed in the bottom of the fourth opening (S205). FIG. 15 shows a schematic cross-section view of the corresponding semiconductor structure.

Referring to FIG. 15, after forming the fourth openings 123 but prior to forming second nanowires 125, a thermal oxidation treatment process may be performed to form a barrier layer 103 on the bottom of each fourth opening 123. The barrier layer 103 may prevent the subsequently formed second semiconductor layer from covering the surface of the semiconductor substrate 101. In addition, the barrier layer 103 may also prevent atoms of the material that is subsequently filled into the fourth openings to form gate electrodes from diffusing into the semiconductor substrate 101. Therefore, the performance of the ultimately formed semiconductor device may be effectively improved.

Figure 16:
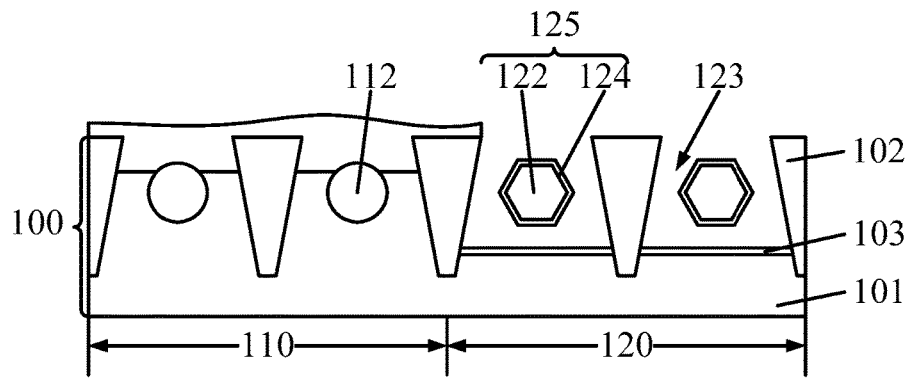

Returning to FIG. 23, a second nanowire may be formed by depositing a second semiconductor layer on the surface of each second epitaxial wire (S206). FIG. 16 shows the corresponding semiconductor structure with a second semiconductor layer formed on the surface of each second epitaxial wire.

Referring to FIG. 16, a second semiconductor layer 124 may be formed on the surface of the plurality of second epitaxial wire 122. As such, each second semiconductor layer 124 together with the corresponding second epitaxial wire 122 may form a second nanowire 125.

In one embodiment, during the thermal oxidation treatment process performed on the bottom of the fourth openings 123 to form the barrier layer 103, the surface of the plurality of second epitaxial wires 122 may also be oxidized. Therefore, in order to ensure that the second semiconductor layer 124 is formed to cover the surface of each second epitaxial wire 122, the fabrication process may further include removing the oxide layer formed on the surface of the second epitaxial wires 122 after forming the barrier layer 103. The second semiconductor layer 124 may then be formed after the removal of the oxide layer from the surface of the second epitaxial wires 122.

Specifically, in one embodiment, the second epitaxial wires 122 may be made of silicon germanium, during the thermal oxidation treatment process to form the barrier layer 103, the oxide layer formed on the surface of the second epitaxial wires 122 may have a smaller thickness and smaller density as compared to the barrier layer 103 formed on the bottom of the fourth openings 123. As such, the etching rate on the oxide layer formed on the surface of the second epitaxial wires 122 may be high. Therefore, the oxide layer formed on the surface of the second epitaxial wires 122 may be removed through a wet etching process by controlling the etching time. After removing the oxide layer formed on the surface of the second epitaxial wires 122, the barrier layer 103 may still remain.

The second semiconductor layer 124 may be made of a Group III-V semiconductor, such as InGaAs, InAs, etc. Therefore, the second nanowire 125 may be a Group III-V nanowire with a core made of a germanium-containing material. The second semiconductor layer 124 may be formed by a CVD process, an MBE process, or an ALD process. In one embodiment, the second semiconductor layer 124 may be formed on the surface of the second epitaxial wires 122 through a MOCVD process.

In one embodiment, the cross-section of each second epitaxial wire 122 may have a sigma shape. Therefore, most of the second semiconductor layer 124 formed on the surface of the second epitaxial wire 122 may be Group III-V semiconductor orientated along the (111) crystal direction. Using the second nanowire 125 as the channel of the semiconductor device, high channel electron mobility may be obtained and the performance of the ultimately formed semiconductor device may be effectively improved.

Figure 17:
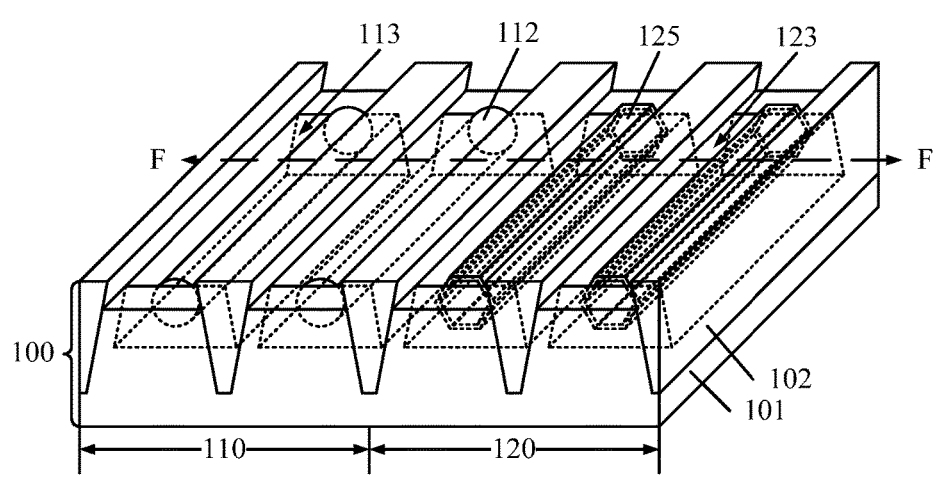
Figure 18:
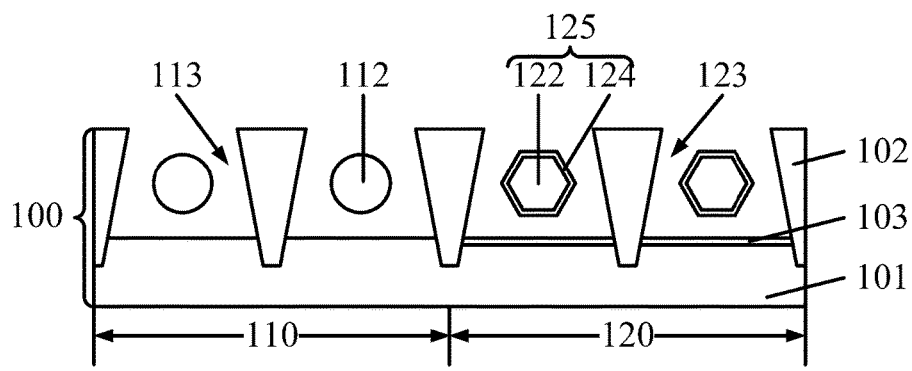

Further, returning to FIG. 23, a plurality of second openings may be formed in the base of the PMOS regions with each first epitaxial wire hanging above the bottom surface of the corresponding second opening (S207). FIG. 17 shows a schematic view of the corresponding semiconductor structure. FIG. 18 shows a schematic cross-section view of the semiconductor structure shown in FIG. 17 along an FF line.

Referring to FIG. 17, a plurality of second openings 113 may be formed in the base 100 of the PMOS regions. After forming the second openings 113, each first epitaxial wire 122 may be connected with the sidewalls of a corresponding second opening 113 and may be hung above the bottom of the second opening 113.

In one embodiment, in order to avoid affecting the second nanowires 125 formed in the base 100 of the NMOS regions 120, prior to forming the second openings 113 in the base 100 of the PMOS regions, the fabrication method may further include forming a fifth mask layer on the surface of the base 100 of the NMOS regions to protect the second nanowires 125.

Further, because each first epitaxial wire 112 may be formed between two neighboring isolation structures 102, the formation process for the plurality of second openings 113 may include removing a portion of the semiconductor substrate 101 between neighboring isolation structures in the PMOS regions. Specifically, after removing the portion of the semiconductor substrate 101, the top surface of the semiconductor substrate 101 between neighboring isolation structures may be lower than the top surface of the first epitaxial wires 112. In one embodiment, the second openings 113 may be formed in the base 100 of the PMOS regions through a method combining both dry etching and wet etching.

The depth of the second openings 113 may not be too small. When the depth of the second openings 113 is too small, it might be difficult to suspend the first epitaxial wires 112 above the base 100 in the second openings 113. In addition, a small depth of the second openings 113 may not be conducive to forming a gate electrode in a subsequent process to surround each first nanowire. The depth of the second openings 113 may not be too large either. When the depth of the second openings 113 is excessively large, the fabrication process may be more difficult and the materials may be wasted. Therefore, in one embodiment, the depth of the second openings 113 may be in a range of 50 nm to 100 nm.

Figure 19:
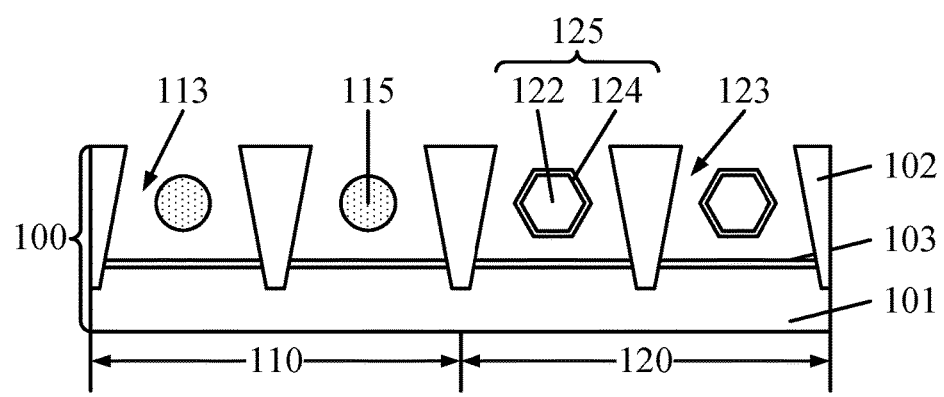

Further, returning to FIG. 23, a thermal oxidation treatment process may be performed on the first epitaxial wires and then the oxide layer formed on the surface of the first epitaxial wires may be removed to form a plurality of first nanowires (S208). FIG. 19 shows a schematic view of the corresponding semiconductor structure.

Referring to FIG. 19, a thermal oxidation treatment process may be performed on the first epitaxial wires 112. During the thermal oxidation treatment process, the bottom surface of each second opening 113 may be oxidized; in the meantime, an oxide layer may also be formed on the surface of the first epitaxial wires 112. The oxide layer formed on the surface of the first epitaxial wires 112 may then be removed to form a plurality of first nanowires 115.

The plurality of first nanowires 115 may then serve as the channels of the PMOS devices formed in a subsequent process. In one embodiment, the plurality of first nanowires 115 are made of silicon germanium nanowires with high hole mobility. Specifically, the germanium element in the first nanowires 115 may have a weight percentage in a range of 15% to 95%.

Specifically, the Gibbs free energy required for forming $SiO_2$ from Si is lower than the Gibbs free energy required for forming $GeO_2$ from Ge. Therefore, when Si and Ge are both sufficient, $SiO_2$ may be more likely formed than $GeO_2$ during the thermal oxidation treatment process. As such, after performing the thermal oxidation treatment process on the surface of the silicon germanium made first epitaxial wires 112, an oxide layer, i.e. a $SiO_2$ layer, may be formed on the surface of the first epitaxial wires 112.

The oxide layer may then be removed. That is, the oxide layer formed from a portion of silicon may be removed. Therefore, the silicon concentration in the first epitaxial wires 112 made of silicon germanium may be reduced and, in the meantime, the germanium concentration may be increased. Moreover, by performing the thermal oxidation treatment process and the oxide-removal process for multiple times, the germanium concentration in the first epitaxial wires 112 may be continuously improved. In one embodiment, the germanium concentration in the first nanowires 112 may be in a range of 15% to 95%.

Moreover, performing the thermal oxidation treatment process on the first epitaxial wires 115 may ensure full relaxation for the atoms in the formed first nanowires 115. Therefore, the surface of the formed first nanowires 115 may be very smooth, which may be conducive to improving the performance of the ultimately formed semiconductor device.

In one embodiment, during the formation of the first nanowires 115, the thermal oxidation treatment process performed on the first epitaxial wires 112 and the oxide-removal process may be alternately performed for multiple times such as about 2 to 3 times in order to improve the germanium concentration in the first nanowires 115 and make the surface of the first nanowires 115 smoother.

During the thermal oxidation treatment on the first epitaxial wires 112, oxide may be formed not only on the surface of the first epitaxial wires 112, but also on the surface of the semiconductor substrate 101 on the bottom of each second opening 113. The oxide layer formed on the semiconductor substrate 101 on the bottom of the second openings 113 may provide protection for the semiconductor substrate 101 during subsequent processes. In addition, the oxide layer formed on the semiconductor substrate 101 may also prevent atoms in the subsequently-formed gate electrodes from diffusing into the semiconductor substrate 101. Therefore, the process to remove the oxide layer formed on the surface of the first epitaxial wires 112 may not remove the oxide layer formed on the surface of the semiconductor substrate 101 on the bottom of the second openings 113.

Figure 20:
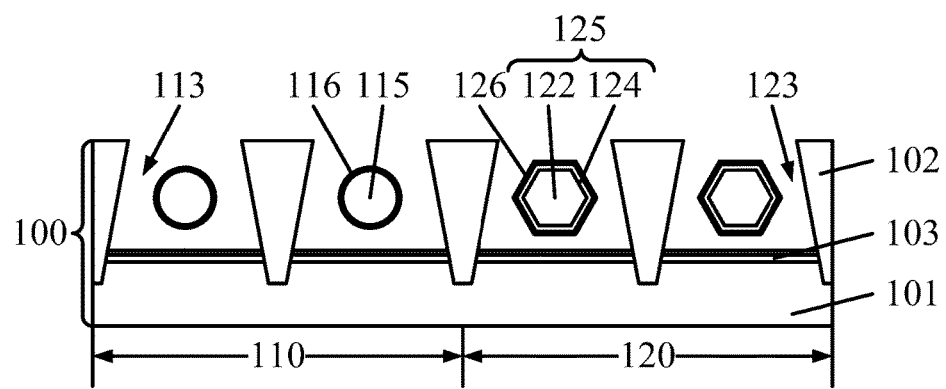

Further, returning to FIG. 23, a first dielectric layer covering the plurality of first nanowires and a second dielectric layer covering the plurality of second nanowires may be formed (S209). FIG. 20 shows a schematic view of the corresponding semiconductor structure.

Referring to FIG. 20, a first dielectric layer 116 may be formed to cover the circumference of the first nanowires 115 and a second dielectric layer 126 may be formed to cover the circumference of the second nanowires 116.

In one embodiment, prior to forming the first dielectric layer 116 and the second dielectric layer 126, the fabrication method may also include performing a process to clean the formed semiconductor structure. The cleaning process may remove the impurities generated during the semiconductor fabrication process described above and, thus provide a clean operating surface for subsequent fabrication processes.

In one embodiment, the semiconductor nanowire device to be formed is a high-k metal gate (HKMG) transistor. Therefore, both of the first dielectric layer 116 and the second dielectric layer 126 may be made of a high-k dielectric material (i.e., a material with a dielectric constant greater than 3.9) so that the first dielectric layer 116 and the second dielectric layer 126 may then serve as the gate dielectric layers in the formed semiconductor device. Specifically, the first dielectric layer 116 and the second dielectric layer 126 may be made of one or more of $HfO_2$, $TiO_2$, HfZrO, HfSiNo, $Ta_2O_5$, $ZrO_2$, $ZrSiO_2$, $Al_2O_3$, $SrTiO_3$, and BaSrTiO.

In addition, the bottom surface of the second openings 113 and the bottom surface of the fourth openings 123 may also be covered by high-k dielectric material. The high-k dielectric material formed to cover the bottom surfaces of the second openings 113 and the fourth openings 123 may improve the protection on the semiconductor substrate 101. Therefore, the production yield may be increased and the stability of the formed semiconductor device may also be improved.

Figure 21:
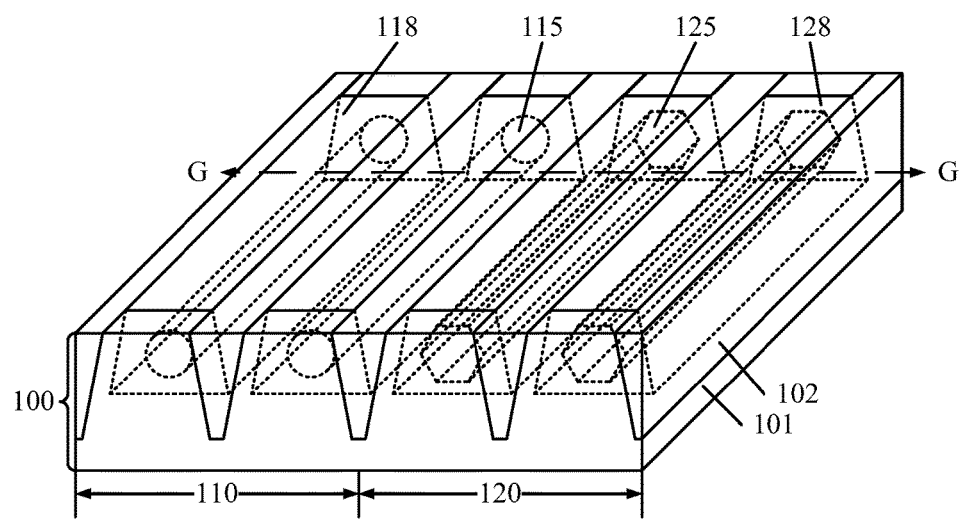
Figure 22:
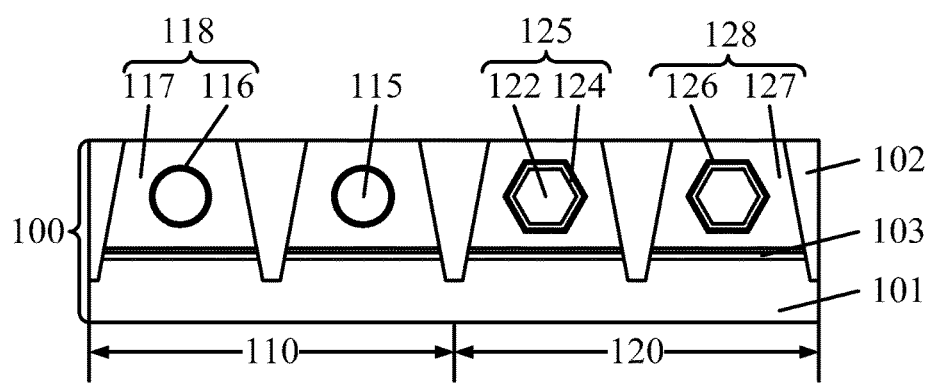

Further, returning to FIG. 23, a first wrap-gate structure may be formed to surround each first nanowire while a second wrap-gate structure may be formed to surround each second nanowire (S210). FIG. 21 shows a schematic view of the corresponding semiconductor structure. FIG. 22 shows a cross-section view of the semiconductor structure shown in FIG. 21 along a GG line.

Referring to FIG. 21, a first wrap-gate structure 118 may be formed to surround each first nanowire 115 and a second wrap-gate structure 128 may be formed to surround each second nanowire 125. The first wrap-gate structure 118 may further include a first dielectric layer 116 and a first wrap-gate electrode 117. The second wrap-gate structure 128 may further include a second dielectric layer 126 and a second wrap-gate electrode 127.

In one embodiment, each first enclosure electrode 117 may be formed by filling the corresponding second opening 113 with a conductive material while each second enclosure electrode 117 may also be formed by filling the corresponding fourth opening 123 with a conductive material.

In one embodiment, the conductive material may be a metal including one or more of Al, Cu, Ag, Au, Pt, Ni, Ti, TiN, TlN, Tl, TlC, TaSiN, W, $W_2N$, and $WSi_2$. The conductive material may be filled into the second openings 113 and the fourth openings 123 through an ALD process, a CVD process, or an MBE process. In one embodiment, the conductive material may be filled into the second openings 113 and the fourth openings 123 through a MOCVD process.

In one embodiment, the first enclosure electrodes 117 may be formed to surround the first nanowires 115 and the second enclosure electrodes 127 may be formed to surround the second nanowires 125. A plurality of channels of the semiconductor device may be situated in the first nanowires 115 and the second nanowires 125. Therefore, the first enclosure electrode 117 and the second enclosure electrode 127 may be able to effectively control the corresponding channels in the semiconductor device. Thus, the performance of the formed semiconductor device may be improved.

Moreover, after forming the gate electrodes, the fabrication method may further include performing a planarization treatment process on the semiconductor device to make the top surfaces of the first gate electrodes 117, the second gate electrodes 127 and the isolation structures 102 formed in the base 100 leveled with each other. Specifically, a chemical mechanical polishing (CMP) method or an etch back method may be adopted during the planarization treatment process performed on the semiconductor device.

The present disclosure also provides a semiconductor nanowire device. Referring to FIG. 21 and FIG. 22, the semiconductor nanowire device may include a base 100. The base 100 may further include a plurality of PMOS regions 110 and a plurality of NMOS regions 120. The PMOS regions 110 may be used to form PMOS devices while the NMOS regions 120 may be used to form NMOS devices. The base 100 may further include a semiconductor substrate 101 and a plurality of isolation structures 102 formed in the semiconductor substrate 101.

The semiconductor substrate 101 may provide an operating platform for subsequent device fabrication processes. The semiconductor substrate 101 may be made of single crystalline silicon, polycrystalline silicon, or amorphous silicon. The semiconductor substrate 101 may also be made of germanium, gallium arsenide, or silicon germanium. The semiconductor substrate 101 may have an epitaxial layer or may be silicon on an epitaxial layer. Moreover, the semiconductor substrate 101 may also be any appropriate semiconductor material. In one embodiment, the semiconductor substrate 101 is made of silicon.

The plurality of isolation structures 102 may be used to electrically isolate neighboring semiconductor structures. The isolation structures 102 may be made of one or more of $SiO_x$, $SiN_x$, SiON, low-k dielectric material (i.e. material with a dielectric constant greater than or equal to 2.5, but smaller than 3.9), and ultra-low-k dielectric material (i.e. material with a dielectric constant less than 2.5). In one embodiment, the isolation structures 102 are made of $SiO_x$.

The distance between neighboring isolation structures 102 may not be too small; otherwise, subsequent formation of nanowire may be affected. The distance between neighboring isolation structures 102 may not be too large either; otherwise, a large distance may be detrimental to improving the component density and the integration degree. In one embodiment, the distance between neighboring isolation structures 102 may be in a range of 10 nm to 50 nm.

Further, the semiconductor nanowire device may include a plurality of first nanowires 115 formed in the base of the PMOS regions with each first nanowire 115 surrounded by a corresponding first wrap-gate structure 118. In addition, the semiconductor nanowire device may also include a plurality of second nanowires 125 formed in the base of the NMOS regions with each second nanowire 125 surrounded by a corresponding second wrap-gate structure 128.

The plurality of first nanowires 115 may serve as the channels of the ultimately formed PMOS devices. In one embodiment, the first nanowires 115 may be silicon germanium nanowires with high hole mobility. Specifically, the germanium element in the first nanowires 115 may have a weight percentage in a range of 15% to 95%.

The plurality of second nanowires 125 may serve as the channels of the ultimately formed NMOS devices. In one embodiment, the second nanowires 115 may further include a plurality of second epitaxial wires 122 and a plurality of second semiconductor layers 124 formed to cover the surface of the second epitaxial wires 122.

In one embodiment, the plurality of second epitaxial wires 122 may be silicon germanium nanowires and may be formed through a same fabrication process to form the plurality of first nanowires 115. The second semiconductor layer 124 may be made of a III-V group semiconductor, such as InGaAs, InAs, etc. Therefore, the second nanowire 125 may be a III-V group nanowire with a silicon germanium core.

Further, perpendicular to the extending direction of each second nanowire 125, the cross-section of the second nanowire 125 may have a sigma shape. That is, in a plane perpendicular to the extending direction of the second nanowire 125, the interface shape of the second nanowire may be 'sigma' like. Therefore, most of the second semiconductor layer 124 formed on the surface of the second epitaxial wire 122 may be III-V semiconductor orientated along the (111) crystal direction. Using the second nanowire 125 with such a structure as the channel of the semiconductor device, high channel electron mobility may be obtained and the performance of the ultimately formed semiconductor device may be effectively improved.

Further, each first wrap-gate structure 118 may include a first dielectric layer 116 and a first wrap-gate electrode 117 while each second wrap-gate structure 128 may include a second dielectric layer 126 and a second wrap-gate electrode 127.

In one embodiment, the semiconductor nanowire device to be formed is a high-k metal gate (HKMG) transistor. Therefore, both of the first dielectric layer 116 and the second dielectric layer 126 may be made of a high-k dielectric material (i.e., a material with a dielectric constant greater than 3.9) so that the first dielectric layer 116 and the second dielectric layer 126 may then serve as the gate dielectric layers in the formed semiconductor device. Specifically, the first dielectric layer 116 and the second dielectric layer 126 may be made of one or more of $HfO_2$, $TiO_2$, HfZrO, HfSiNo, $Ta_2O_5$, $ZrO_2$, $ZrSiO_2$, $Al_2O_3$, $SrTiO_3$, and BaSrTiO.

The plurality of first enclosure electrodes 117 and the plurality of second enclosure electrodes 127 may be made of a conductive material. In one embodiment, the conductive material may be a metal including one or more of Al, Cu, Ag, Au, Pt, Ni, Ti, TiN, TlN, Tl, TlC, TaSiN, W, $W_2N$, and $WSi_2$. The conductive material may be filled into the second openings 113 and the fourth openings 123 through an ALD process, a CVD process, or an MBE process.

The channels of the semiconductor device may be situated in the first nanowires 115 and the second nanowires 125. Moreover, each first wrap-gate structure 118 may surround a corresponding first nanowire 115 and each second wrap-gate structure 128 may surround a corresponding second nanowire 125. Therefore, the first wrap-gate structures 118 and the second wrap-gate structures 128 may be able to effectively control the corresponding channels in the semiconductor device. Thus, the performance of the formed semiconductor device may be improved.

The semiconductor nanowire device may further include a barrier layer 103 formed between each first wrap-gate structure 118 and the base 100 and also between each second wrap-gate structure 128 and the base 100. In addition, the semiconductor nanowire device may also include a high-k dielectric material layer formed to cover the barrier layer 103. The presence of the barrier layer 103 and the high-k dielectric material layer in the semiconductor nanowire device may prevent the conductive material that is used to form the first enclosure electrodes 117 and the second enclosure electrode 127 from diffusing into the base 100. Therefore, the performance and the stability of the formed semiconductor device may be improved. Moreover, during the fabrication process for the semiconductor device, the barrier layer 103 and the high-k dielectric material layer may provide protection for the base 100 so that damages to the base 100 may be avoided and the production yield of the semiconductor device may also be improved.

Compared to existing fabrication method for semiconductor nanowire devices, the disclosed fabrication methods may demonstrate several advantages.

According to the disclosed methods, the plurality of first epitaxial wires may be formed by directly filling the plurality of first openings with a germanium-containing material. Therefore, the germanium-containing material may be distributed uniformly in the first epitaxial wires, which may be conducive to improving the germanium concentration in the first nanowires through a thermal oxidation process. In addition, uniformly distributed germanium-containing material in the first epitaxial wires 112 may also help to improve the channel properties of the ultimately formed semiconductor device, and thus improve the performance of the semiconductor device.

Moreover, in addition to improving the germanium concentration in the first nanowires, the thermal oxidation treatment process may also ensure full relaxation for the atoms in the formed first nanowires. Therefore, the surface of the formed first nanowires may be very smooth, which may be conducive to improving the performance of the ultimately formed semiconductor device.

Further, the base of the disclosed semiconductor nanowire device may also include NMOS regions used to form NMOS devices. Accordingly, a plurality of second nanowires may be formed in the base of the NMOS devices. Each second nanowire may further include a second epitaxial wire made of a germanium-containing material and a second semiconductor layer covering the second epitaxial wire. The cross-section of the second epitaxial wire may have a sigma shape. Therefore, most of the second semiconductor layer formed on the surface of the second epitaxial wire may be Group III-V semiconductor orientated along the (111) crystal direction. Using the second nanowire 125 with such a structure as the channel of the semiconductor device, high channel electron mobility may be obtained and the performance of the ultimately formed semiconductor device may be effectively improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor nanowire device, comprising:
    forming a base including a plurality of PMOS regions;
    forming a plurality of first openings in the base of each PMOS region;
    forming a plurality of first epitaxial wires by filling the plurality of first openings in the PMOS region with a germanium-containing material;
    forming a second opening in the base of the PMOS region by etching a portion of the base under each first epitaxial wire, wherein each first epitaxial wire is connected to both sidewalls of a corresponding second opening and is hung above a bottom surface of the corresponding second opening;
    forming an oxide layer by oxidizing a surface of each first epitaxial wire and forming a barrier layer by oxidizing a surface of the base at the bottom of each second opening, in a thermal oxidation treatment process;
    forming a second nanowire by removing the oxide layer from each first epitaxial wire in an etching process, wherein a portion of the barrier layer is also removed from the bottom of the second opening; and
    forming a first wrap-gate structure to surround each first nanowire in the second opening, wherein a remaining portion of the barrier layer is between the first wrap-gate structure and the base.

2. The method for fabricating the semiconductor nanowire device according to claim 1, wherein each first opening formed in the base of the PMOS regions has a bowl shape.

3. The method for fabricating the semiconductor nanowire device according to claim 1, wherein a length of each first epitaxial wire is in a range of 2 nm to 50 nm.

4. The method for fabricating the semiconductor nanowire device according to claim 1, wherein a diameter of each first epitaxial wire is in a range of 2 nm to 5 nm.

5. The method for fabricating the semiconductor nanowire device according to claim 1, wherein the germanium-containing material is filled into the plurality of first openings by a method selected from a chemical vapor deposition, a molecular beam epitaxy, and an atomic layer deposition.

6. The method for fabricating the semiconductor nanowire device according to claim 1, wherein the germanium element in the first nanowire has a weight percentage in a range of 15% to 95%.

7. The method for fabricating the semiconductor nanowire device according to claim 6, wherein the first nanowire with a germanium weight percentage in the range of 15% to 95% are formed by alternately performing the thermal oxidation treatment process and the oxide-removal process for multiple times.

8. The method for fabricating the semiconductor nanowire device according to claim 1, wherein the base further includes a plurality of NMOS regions, and accordingly:
    when forming the plurality of first openings in the base of each PMOS region, a plurality of third openings are formed in the base of each NMOS region;
    when forming the plurality first epitaxial wires in the PMOS regions with the germanium-containing material, a plurality of second epitaxial wires are formed by filling the plurality of third openings in the NMOS regions with a first semiconductor material;
    forming a fourth opening in the base of the NMOS region by etching a portion of the base under each second epitaxial wire, wherein each second epitaxial wire is connected to both sidewalls of a corresponding fourth opening and is hung above a bottom surface of the corresponding fourth opening;
    forming a second nanowire by forming a second semiconductor layer on a surface of each second epitaxial wire; and
    forming a second wrap-gate structure to surround each second nanowire.

9. The method for fabricating the semiconductor nanowire device according to claim 8, wherein forming the plurality of third openings further includes:
    forming a plurality of first openings in the base of each NMOS region when forming the plurality of first openings in the base of each PMOS region; and
    forming a plurality of third openings in the base of each NMOS region by further etching the base of each NMOS region through the plurality of first openings.

10. The method for fabricating the semiconductor nanowire device according to claim 8, wherein each third opening formed in the base of the NMOS regions has a sigma shape.

11. The method for fabricating the semiconductor nanowire device according to claim 8, wherein the first semiconductor material includes silicon germanium.

12. A method for fabricating a semiconductor nanowire device, comprising:
    forming a base including a plurality of PMOS regions and a plurality of NMOS regions;
    forming a plurality of first openings in the base of the PMOS regions;
    forming a plurality of first epitaxial wires by filling the plurality of first openings in the PMOS regions with a germanium-containing material and a plurality of second epitaxial wires by filling the plurality of third openings in the NMOS regions with a first semiconductor material;

forming a plurality of second openings in the base of the PMOS regions by etching a portion of the base under each first epitaxial wire, wherein each first epitaxial wire is connected to both sidewalls of a corresponding second opening and is hung above a bottom surface of the corresponding second opening;

performing a thermal oxidation treatment process on the plurality of first epitaxial wires to form an oxide layer on each first epitaxial wire;

forming a plurality of first nanowires by removing the oxide layer from each first epitaxial wire; and forming a first wrap-gate structure to surround each first nanowire;

forming a plurality of fourth openings in the base of the NMOS regions by etching a portion of the base under each second epitaxial wire, wherein each second epitaxial wire is connected to both sidewalls of a corresponding fourth opening and is hung above a bottom surface of the corresponding fourth opening;

after forming the plurality of fourth openings and prior to forming the second nanowires, performing a thermal oxidation treatment process on a bottom surface of each fourth opening;

forming a plurality of second nanowires by forming a second semiconductor layer on a surface of each second epitaxial wire; and forming a second wrap-gate structure to surround each second nanowire.

13. The method for fabricating the semiconductor nanowire device according to claim 8, wherein the second semiconductor layer is made of a material including a Group III-V semiconductor material.

14. The method for fabricating the semiconductor nanowire device according to claim 13, wherein the second semiconductor layer is formed on each second nanowire by a method selected from a chemical vapor deposition, a molecular beam epitaxy, and an atomic layer deposition.

15. The method for fabricating the semiconductor nanowire device according to claim 12, wherein a length of each first epitaxial wire is in a range of 2 nm to 50 nm.

16. The method for fabricating the semiconductor nanowire device according to claim 12, wherein a diameter of each first epitaxial wire is in a range of 2 nm to 5 nm.

17. The method for fabricating the semiconductor nanowire device according to claim 12, wherein the germanium-containing material is filled into the plurality of first openings by a method selected from a chemical vapor deposition, a molecular beam epitaxy, and an atomic layer deposition.

18. The method for fabricating the semiconductor nanowire device according to claim 12, wherein the germanium element in the plurality of first nanowires has a weight percentage in a range of 15% to 95%.

19. The method for fabricating the semiconductor nanowire device according to claim 18, wherein the plurality of first nanowires with a germanium weight percentage in the range of 15% to 95% are formed by alternately performing the thermal oxidation treatment process and the oxide-removal process for multiple times.

20. The method for fabricating the semiconductor nanowire device according to claim 1, wherein the oxide layer has a smaller thickness and a smaller density than the barrier layer.

* * * * *